(12) United States Patent
Kim

(10) Patent No.: US 8,169,064 B2
(45) Date of Patent: May 1, 2012

(54) NESTED INTEGRATED CIRCUIT PACKAGE ON PACKAGE SYSTEM

(75) Inventor: Hyun Uk Kim, Seoul (KR)

(73) Assignees: Stats Chippac Ltd., Singapore (SG); Stats Chippac, Inc., Fremont, CA (US)

( * ) Notice: Subject to any disclaimer, the term of this patent is extended or adjusted under 35 U.S.C. 154(b) by 23 days.

(21) Appl. No.: 11/849,263

(22) Filed: Aug. 31, 2007

(65) Prior Publication Data

US 2007/0290319 A1    Dec. 20, 2007

Related U.S. Application Data

(63) Continuation of application No. 11/257,894, filed on Oct. 24, 2005, now Pat. No. 7,279,786.

(60) Provisional application No. 60/650,279, filed on Feb. 4, 2005.

(51) Int. Cl.
*H01L 23/02* (2006.01)

(52) U.S. Cl. .......... 257/686; 257/724; 438/107

(58) Field of Classification Search .......... 257/777, 257/686, 723, 724, 698, 187; 438/107, 109, 438/110, 112
See application file for complete search history.

(56) References Cited

U.S. PATENT DOCUMENTS

| | | | | |
|---|---|---|---|---|
| 5,373,189 A * | 12/1994 | Massit et al. | | 257/686 |
| 5,939,782 A * | 8/1999 | Malladi | | 257/698 |
| 5,963,430 A * | 10/1999 | Londa | | 361/790 |
| 6,313,522 B1 * | 11/2001 | Akram et al. | | 257/686 |
| 6,507,098 B1 * | 1/2003 | Lo et al. | | 257/686 |
| 6,558,978 B1 | 5/2003 | McCormick | | |
| 6,650,009 B2 | 11/2003 | Her et al. | | |
| 6,787,916 B2 * | 9/2004 | Halahan | | 257/777 |
| 6,818,978 B1 * | 11/2004 | Fan | | 257/686 |
| 6,861,288 B2 | 3/2005 | Shim et al. | | |
| 6,861,761 B2 | 3/2005 | Yang et al. | | |
| 6,867,500 B2 | 3/2005 | Corisis et al. | | |
| 7,071,545 B1 * | 7/2006 | Patel et al. | | 257/686 |
| 7,217,994 B2 * | 5/2007 | Zhu et al. | | 257/686 |

FOREIGN PATENT DOCUMENTS

| | | |
|---|---|---|
| JP | 08-213543 A | 8/1996 |
| JP | 10-070233 A | 3/1998 |
| JP | 2001-267490 A | 9/2001 |
| JP | 2002158326 A | 5/2002 |

OTHER PUBLICATIONS

Interrogative Office Action for Application No. 554259/2007 dated May 10, 2011.

* cited by examiner

*Primary Examiner* — S. V. Clark

(74) *Attorney, Agent, or Firm* — Ishimaru & Associates LLP; Mikio Ishimaru; Stanley Chang

(57) ABSTRACT

A package on package system is provided including providing a first substrate having a first integrated circuit thereon and a second substrate having a second integrated circuit thereon, the second substrate having a recess provided therein. The first and second substrates are mounted having the first integrated circuit at least partially nested in the recess.

20 Claims, 3 Drawing Sheets

NESTED INTEGRATED CIRCUIT PACKAGE ON PACKAGE SYSTEM

CROSS-REFERENCE TO RELATED APPLICATION(S)

This application is a continuation of U.S. Non Provisional patent application Ser. No. 11/257,894 filed Oct. 24, 2005, now U.S. Pat. No. 7,279,786, which claims the benefit of U.S. Provisional Patent Application Ser. No. 60/650,279 filed Feb. 4, 2005, and the subject matter thereof is hereby incorporated herein by reference thereto.

TECHNICAL FIELD

The present invention relates generally to integrated circuit package systems, and more particularly to a system for Package in Packages (PIP) or Package on Package (POP).

BACKGROUND ART

In order to conserve the amount of surface area, or "real-estate," consumed by integrated circuits on a carrier substrate, such as a circuit board, various types of increased density packages have been developed. Among these types of increased density packages is the so-called "multi-chip module" (MCM). Some types of multi-chip modules include assemblies of integrated circuits that are stacked one on top of another. The amount of surface area on a carrier substrate that may be saved by stacking integrated circuits is readily apparent.

The system of increasing semiconductor density on a circuit board by stacking semiconductor packaged devices one on top of another is commonly referred to a "package to package" or a "package on package" assembly. One problem with the current package to package system assembly is difficulties caused by irregularities in the flatness/coplanarity of the lower package. Another problem results from the increased stiffness of the overall assembly, which can lead to reduced board level reliability. Still another problem can arise from poor heat dissipation from the upper package.

The typical package on package stacked semiconductor assembly uses an interposer structure between the first package and the second package. A second package fits mounts onto an interposer substrate using a ball grid array (BGA) interface. The interposer substrate provides electrical contact points at the peripheral boundary. The second package electrically couples to the first substrate through the ball grid array (BGA) interface through the interposer substrate then connected to the first substrate. This packaging system and design requires additional interposer structure and manufacturing steps to create the package on package assembly with degraded electrical performance.

Thus, a need still remains for a package on package (POP) semiconductor package with a stacking substrate assembly to stack the multiple packages without intermediate structures, such as an interposer. In view of the ever-increasing need to save cost and improve efficiencies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a package on package system including providing a first substrate having a first integrated circuit thereon and a second substrate having a second integrated circuit thereon, the second substrate having a recess provided therein. The first and second substrates are mounted having the first integrated circuit at least partially nested in the recess.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown greatly exaggerated in the figures. Generally, the device can be operated in any orientation. The same numbers are used in all the figures to relate to the same elements.

The term "horizontal" as used herein is defined as a plane parallel to the conventional plane or surface of the die or package or substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
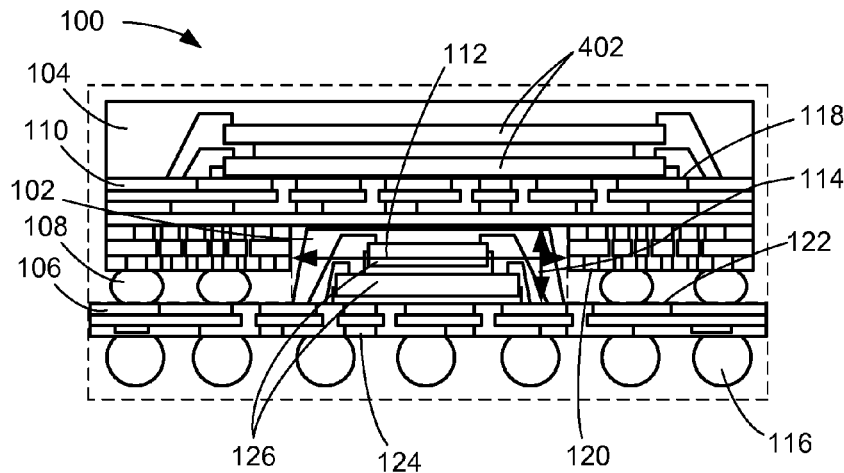
FIG. 1 is a cross-section of an integrated circuit package on package system in accordance with an embodiment of the present invention.

Referring now to FIG. 1, therein is shown a cross-section of an integrated circuit package on package (POP) system 100 in accordance with the present invention. The integrated circuit package on package system 100 comprises a first package 102 stacked below a second package 104.

The first package 102 comprises a first substrate 106, wherein the first substrate 106 comprises a top surface 122 and a bottom surface 124, and a first set of integrated circuits 126 mounted on the top surface 122.

Figure 4:
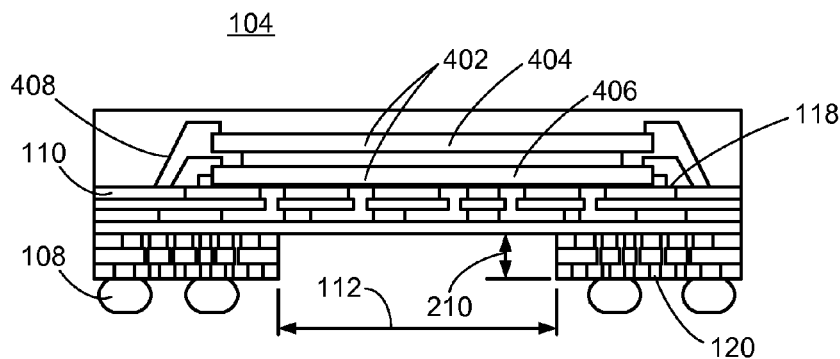
FIG. 4 is a more detailed cross-section of the second package shown in FIG. 1.

The second package 104 comprises a second substrate 110, wherein the second substrate 110 comprises a top surface 118 and a bottom surface 120, and a second set of integrated circuits 402 of FIG. 4 mounted on the top surface 118. A second encapsulant 104 forming the second package 104 on the second set of integrated circuits 402 and the top surface 118. A second ball grid array (BGA) interface 108, such as solder balls, is on the bottom surface 120 of the second substrate 110, wherein the second ball grid array (BGA) interface 108 provides electrical, mechanical, and thermal connectivity between the first substrate 106 and the second substrate 110. The bottom surface 120 of the second substrate 110 comprises a predefined recess 112, which is free of the second encapsulant, to nest the first set of integrated circuits 126, of the first package 102, mounted on the top surface 122 on the first substrate 106.

A first ball grid array (BGA) interface 116 is on the bottom surface 124 of the first substrate 106, wherein the first ball grid array (BGA) interface 116 provides electrical, mechanical, and thermal connectivity between the first substrate 106 and an external printed circuit board (not shown). For illustrative purposes, the electrical and mechanical interface between the first package 102 and the second package 104 is a ball grid array (BGA) interface 116 in this embodiment, although it is understood that other coupling mechanisms may be used in accordance with the principles of the present invention.

Figure 2:
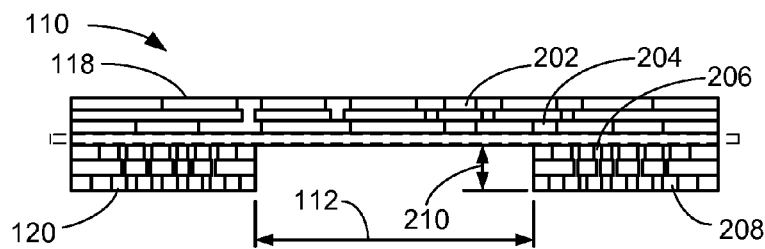
FIG. 2 is a more detailed cross-section of the second substrate shown in FIG. 1.

Referring now to FIG. 2, therein is shown a more detailed cross-section of the second substrate 110 shown in FIG. 1. The second substrate 110 has the predefined recess 112 to provide a clearance for the first set of integrated circuits 126 mounted on the top surface 122 on the first substrate 106 of FIG. 1.

The predefined recess 112 comprises a hollowed out area along with a recess height 210 on the bottom surface 120 of the second substrate for nesting at least a portion of the first package 102. The recess height 210 along with the second ball grid array (BGA) interface 108 height accommodates a mold end height 114 of FIG. 1 of the first package 102. For illustrative purposes, the second substrate 110 is shown as a four-layer substrate having a first layer 202, a second layer 204, a third layer 206, and a fourth layer 208. Although the second substrate 110 is shown as four layers, it is understood the number of layers may differ in accordance with the principles of the present invention.

Figure 3:
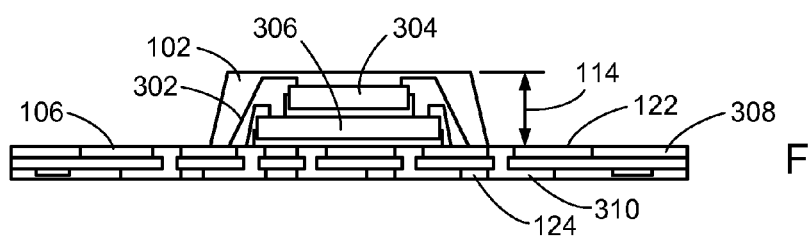
FIG. 3 is a more detailed cross-section of the first package shown in FIG. 1.

Referring now to FIG. 3, therein is shown a more detailed cross-section of the first package 102 shown in FIG. 1. The first package 102 is shown without the first ball grid array (BGA) interface 116 attached to the bottom surface 124 of the first substrate 106. The first package 102 comprising the first set of integrated circuits 126, such as, two stacked semiconductor dice comprising a top semiconductor die 304 above a bottom semiconductor die 306, mounted on the first substrate 106.

The top semiconductor die 304 and the bottom semiconductor die 306 are electrically attached to the top surface 122 of the first substrate 106 by a plurality of wire bond wires 302. It is understood that other techniques, such as direct attach, TAB, or flip chip, may be used to electrically couple the top semiconductor die 304 and the bottom semiconductor die 306 to the top surface 122 of the first substrate 106.

The top surface 122 of the first substrate 106 further comprises a first set of contact points 308. During assembly, the second ball grid array (BGA) interface 108 of FIG. 1 is electrically and mechanically coupled to the first set contact points 308. The bottom surface 124 of the first substrate 106 further comprises a plurality of contact sites 310 for providing electrical, mechanical, and thermal connection to the first ball grid array (BGA) interface 116.

For illustrative purposes, the first set of integrated circuits 126 is shown to comprise the top semiconductor die 304 and the bottom semiconductor die 306 in a stacked orientation, although it is understood the relative orientation of the one or more semiconductor need not be stacked or any combination thereof. In addition, it is understood the top semiconductor die 304 and the bottom semiconductor die 306 may be other elements, such as passive elements and circuits. Furthermore, it is understood that the one or more semiconductor dice size may differ or be similar relative to each other. Additionally, it is understood that the one or more semiconductor dice functionality may differ or be similar.

Referring now to FIG. 4, therein is shown a more detailed cross-section of the second package 104 shown in FIG. 1. The second package 104 comprises the second set of integrated circuits 402 mounted on the top surface 118 of the second substrate 110, wherein the second set of integrated circuits 402 comprise two stacked semiconductor dice comprising a top semiconductor die 404 above a bottom semiconductor die 406. The top semiconductor die 404 and the bottom semiconductor die 406 are shown to be electrically coupled to the second substrate 110 by a plurality of wire bond wires 408. It is understood the techniques, such as direct attach, TAB, or flip chip, may be used to electrically couple the top semiconductor die 404 and the bottom semiconductor die 406 to the second substrate 110.

For illustrative purposes, the second set of integrated circuits 402 is shown to comprise the top semiconductor die 404 and the bottom semiconductor die 406 in a stacked orientation, although it is understood the relative orientation of the one or more semiconductor need not be stacked or any combination thereof. In addition, it is understood the top semiconductor die 404 and the bottom semiconductor die 406 may be other elements, such as passive elements and circuits. Furthermore, it is understood that the one or more semiconductor dice size may differ or be similar relative to each other. Additionally, it is understood that the one or more semiconductor dice functionality may differ or be similar.

Having the predefined recess 112 relaxes the requirements for the small gap between the top semiconductor die 304 on the first substrate 106 and the mold end height 114 on the first substrate 106 so an epoxy molding compound (EMC) having a fine filler size does not have to be used in the molding process of the first package 102.

The predefined recess 112 provides reduced spacing between the first substrate 106 and the second substrate 110. The integrated circuit package on package system 100 with the predefined recess 112 also avoids molding problems, and can accommodate various thicknesses of the top semiconductor die 304 and the bottom semiconductor die 306 as well as other multi-stack possibilities. In one embodiment, the predefined recess 112 may comprise a ring-like structure, although it is understood the predefined recess 112 may comprise different shape and dimension to accommodate the physical dimensions of the first package 102.

Figure 5:
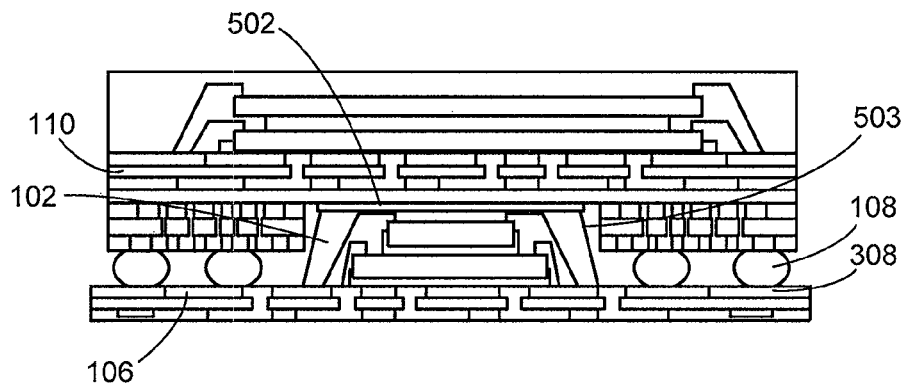
FIG. 5 is a more detailed cross-section of the first package of FIG. 3 nested in the second package of FIG. 4.

Referring now to FIG. 5, therein is shown a more detailed cross-section of the first package 102 nested in the second package 104. An encapsulant 503 covers and protects the first set of integrated circuits 126 and the plurality of wire bond wires 302. The encapsulant 503 isolates the first set of integrated circuits 126 from the second package 104 and has a gap separating the entire surface of the encapsulant 503 from the second substrate 110. An epoxy layer 502 on a substantially horizontal side of the encapsulant 503 of the first package 102 further connects the first package and the second package. Non-horizontal sides of the encapsulant 503 are spaced from the recess 112 of the second substrate 110. The second ball grid array (BOA) interface 108 electrically, mechanically, and thermally couples the bottom surface 120 of the second substrate 110 to the top surface 122 of the first substrate 106.

Figure 6:
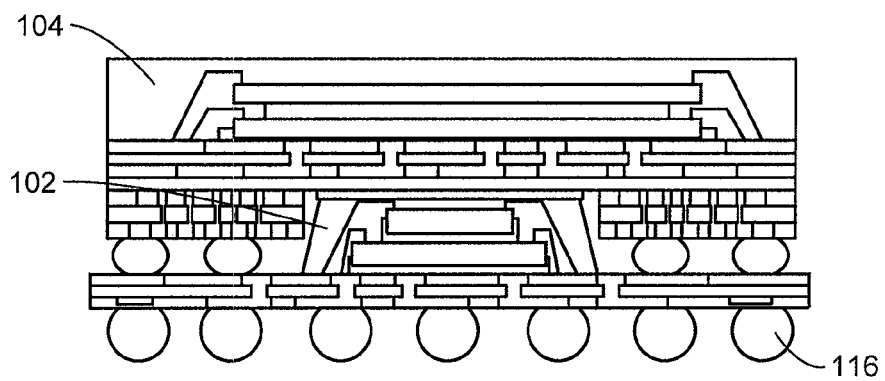
FIG. 6 is a cross-section of a package on package system after assembly and a second backend process.

Referring now to FIG. 6, therein is shown a cross-section of the integrated circuit package on package system 100 after assembly and a second backend process. The second backend process includes such processes as solder ball mount (SBM), singulation (SGN), and external visual inspection (EVI) with the first package 102 further comprising the first ball grid array (BGA) interface 116 electrically coupling to an external printed circuit board (not shown).

Figure 7:
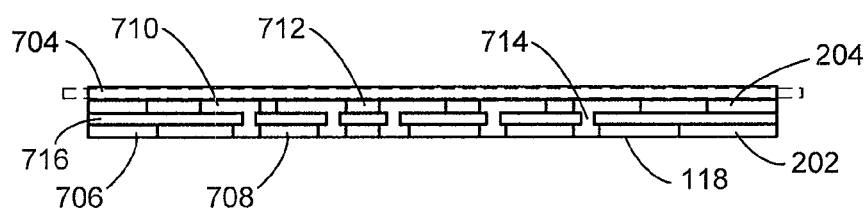
FIG. 7 is a more detailed cross-section of the second substrate of FIG. 2 prior to assembly.

Referring now to FIG. 7, therein is shown a more detailed cross-section of the second substrate 110 of FIG. 2 prior to assembly. The second substrate 110 is shown in an orientation vertically flipped from previous figures, before assembly.

The top surface 118 comprises a flat, two layer substrate comprising the first layer 202 and the second layer 204 coupled with an adhesive layer 704.

The first layer 202 comprises one or more metallic regions 706 used to electrically and mechanically connect the top semiconductor die 404 and the bottom semiconductor die 406 to the second substrate 110 by the plurality of wire bond wires 408. The metallic regions 706 also provide signal conduction paths, voltage supply, ground, and other electrical functions. The first layer 202 of the second substrate 110 also comprises one or more non-metallic insulating regions 708 that insulate the metallic regions 706.

The second layer 204 of the second substrate 110 comprises one or more metallic regions 710. The metallic regions 710 also provide signal conduction paths, voltage supply, ground, and other electrical functions. The second layer 204 of the second substrate 110 comprises one or more non-metallic insulating regions 712 that insulate the metallic regions 710. Selectively, an electrical via 714 electrically couples the metallic region 706 of the first layer 202 to the metallic region 710 of the second layer 204 of the second substrate 110. A dielectric layer 716 insulates and separates the first layer 202 from the second layer 204 of the second substrate 110.

Figure 8:
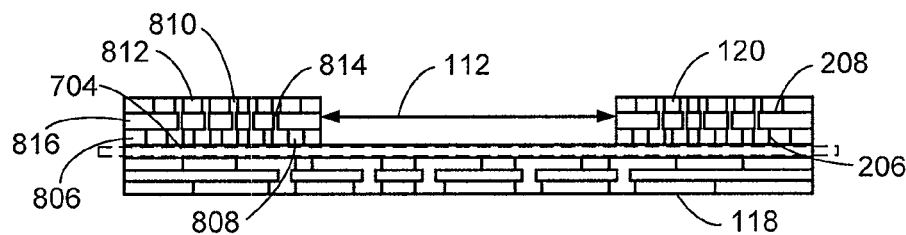
FIG. 8 is a more detailed cross-section of the second substrate of FIG. 2 in accordance with another embodiment of the present invention.

Referring now to FIG. 8, therein is shown a more detailed cross-section of the second substrate 110 of FIG. 2 in accordance with another embodiment of the present invention. The second substrate 110 with the bottom surface 120 being a two layer substrate, comprised of the third layer 206 and the fourth layer 208, bonded to the top surface 118 of the second substrate 110 with the first layer 202 and the second layer 204 to form the second substrate 110. The second substrate 110 has the predefined recess 112 in the bottom surface 120 of the second substrate 110. The third layer 206 of the second substrate 110 comprises one or more metallic regions 806 used for the electrical coupling to the metallic region 710 of the second layer 204 of the second substrate 110. The metallic regions 806 also provide signal conduction paths, voltage supply, ground, and other electrical functions. The third layer 206 of the second substrate 110 comprises one or more non-metallic insulating regions 808 that insulate the metallic regions 806.

The fourth layer 208 of the second substrate 110 comprises one or more metallic regions 810. The metallic regions 810 also provide signal conduction paths, voltage supply, ground, and other electrical functions. The fourth layer 208 of the second substrate 110 comprises one or more non-metallic insulating regions 812 that insulate the metallic regions 810.

Selectively, an electrical via 814 electrically connects the metallic region 806 of the third layer 206 to the metallic regions 810 of the fourth layer 208 of the second substrate 110. A dielectric layer 816 separates the third layer 206 and the fourth layer 208 of the second substrate 110. For illustrative purposes, the electrical connection between substrate layers is describe as electrical vias, although it is understood that other electrical coupling structures may be used.

Figure 9:
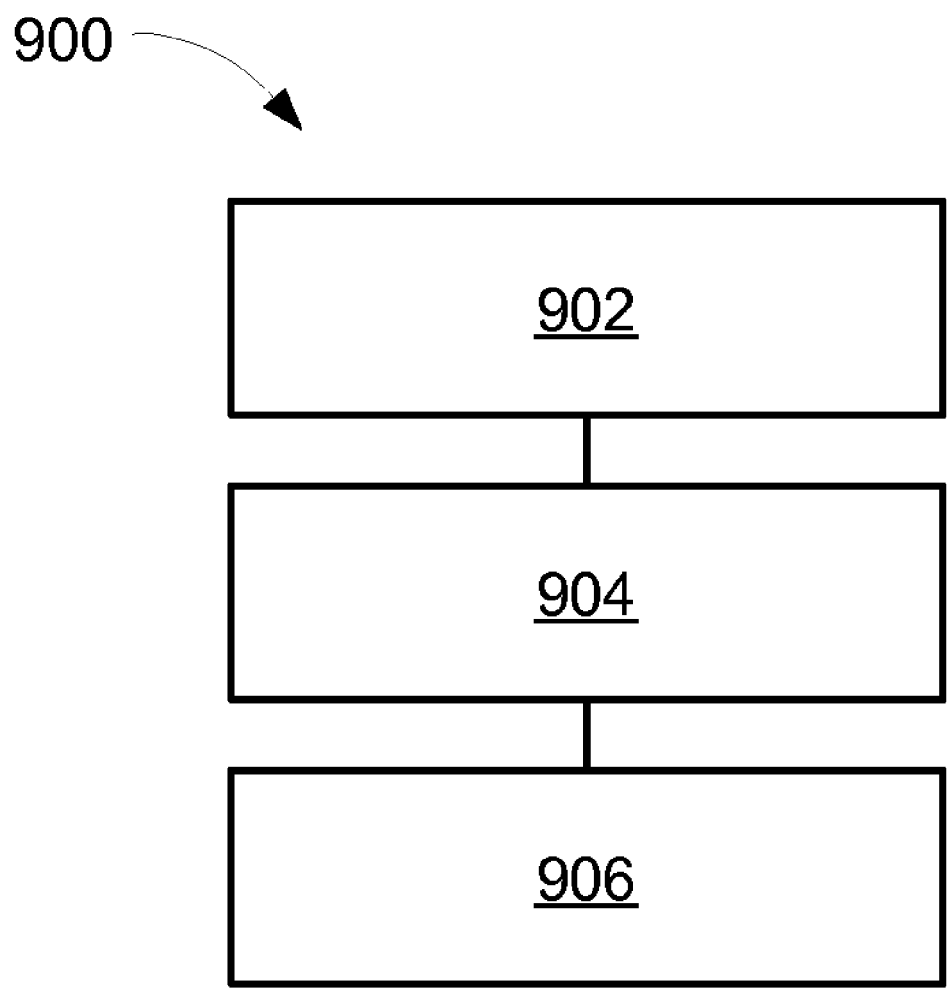
FIG. 9 is a flow chart of a package on package system for manufacturing an integrated circuit package on package system in accordance with a further embodiment of the present invention.

Referring now to FIG. 9, therein is shown a flow chart of a package on package system 900 for manufacturing an integrated circuit package on package system 100 in accordance with a further embodiment of the present invention. The package on package system 900 includes providing a first substrate having a first integrated circuit thereon in a block 902; providing a second substrate having a second integrated circuit thereon, the second substrate having a recess provided therein in a block 904; and mounting the first and second substrate having the first integrated circuit at least partially nested in the recess in a block 906.

In greater detail, a system to provide the integrated circuit package on package system 100 without additional structures, such as interposers, and minimizes the space required to create the package on package stacking scheme, according to an embodiment of the present invention, is performed as follows:

1. The package on package stacking is created utilizing only the attributes of the first substrate 106 of the first package 102 and the second substrate 110 of the second package 104. (FIG. 1)
2. The predefined recess 112 on the bottom surface 120 of the second substrate 110 provides a hollowed out area to nest the first set of integrated circuits 126 mounted on the top surface 122 on the first substrate 106. (FIG. 2)
3. The first package 102 comprising the first substrate 106 having the first set of contact points 308 for the second ball grid array (BGA) interface 108 of the second package 104. (FIG. 3)

An advantage is that the present invention provides more degrees of freedom for the dice thickness or the number of dice in the stack comprised in the first package 102 resulting in relaxed manufacturing flow and materials requirements. For example, the selection of EMC could be broadened to use either the normal or the fine filler size EMC.

It has been discovered that the disclosed structure results in the increased density of the solder balls comprised in the second ball grid array (BGA) interface 108.

It has also been discovered in the present invention that the increased density of the solder balls of the second ball grid array (BGA) interface 108 coupled to more of the first set of contact points 308 of the first substrate 106 results in providing additional signal shielding and electro-magnetic interference (EMI) shielding.

Again, yet another discovery of the present invention is the increased density of the solder balls of the second ball grid array (BGA) interface 108 coupled to more of the first set of contact points 308 of the first substrate 106 results in providing mechanical rigidity for the integrated circuit package on package system 100.

Again, another discovery of the present invention is that the increased density of the solder ball of the second ball grid array (BGA) interface 108 coupled to more of the first set of contact points 308 of the first substrate 106 results in providing additional thermal paths to cool both the first set of integrated circuits 126 and the second set of integrated circuits 402.

Yet another discovery of the present invention is to be able to provide lower power from the second set of integrated circuits 402 resulting from reducing the drive strength of electrical signals only to what is necessary for transmission to and from the first set of integrated circuits 126.

The overall system dimension may be reduced by accommodation of the mold end height 114 of the first package 102 with the bottom surface 120 of the second substrate 110 having the predefined recess 112 providing the hollowed out area for. Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package on package system method and apparatus of the present invention furnish important and heretofore unknown and unavailable solutions, capabilities, and functional advantages. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing a package on package system comprising:
    providing a first package including a first substrate having a first integrated circuit thereon and an encapsulant over the first integrated circuit;
    providing a second package including:
        fabricating a second substrate having a top surface and forming a recess only in a bottom surface,
        mounting a second integrated circuit on the top surface, and
        molding a second encapsulant on the second integrated circuit and the top surface with none of the second encapsulant in the recess; and
    mounting solder balls under the second substrate bottom surface; and
    mounting the second package on the first package having the encapsulant of the first package at least partially nested in the recess and the encapsulant having a gap separating the entire surface of the encapsulant from the second substrate.

2. The method as claimed in claim 1 further comprising:
    molding encapsulant around the first integrated circuit; and
    positioning the encapsulant in the recess.

3. The method as claimed in claim 1 further comprising forming electrical connections between the first and second substrates.

4. The method as claimed in claim 1 further comprising forming electrical connects on the first substrate under the first integrated circuit.

5. The method as claimed in claim 1 wherein providing the second substrate further comprises:
    forming a first layer for having the first integrated circuit thereon; and
    forming a second layer having a through opening provided therein to cooperate with the first layer to form the recess.

6. A method for manufacturing a package on package system comprising:
    providing a first substrate;
    mounting a first set of integrated circuits on the first substrate;
    encapsulating a first package with the first set of integrated circuits on the first substrate and wires connected to the first substrate and the first set of integrated circuits with an encapsulant;
    providing a second substrate having a top surface and a recess provided only in a bottom surface;
    mounting a second set of integrated circuits on the top surface;
    encapsulating a second package with a second encapsulant on the second set of integrated circuits and the top surface including none of the second encapsulant in the recess;
    mounting solder balls under the second substrate bottom surface; and
    mounting the second package on the first package having the encapsulated first set of integrated circuits at least partially nested in the recess and the encapsulant having a gap separating the entire surface of the encapsulant from the second substrate.

7. The method as claimed in claim 6 further comprising bonding the encapsulated first set of integrated circuits to the second substrate.

8. The method as claimed in claim 6 further comprising forming ball grid array connections between the first and second substrates.

9. The method as claimed in claim 6 further comprising forming ball grid array connections on the first substrate under the first set of integrated circuits.

10. The method as claimed in claim 6 wherein providing the second substrate further comprises:
    forming a first layer for carrying the first set of integrated circuits thereon;
    forming a second layer having a through opening provided therein; and
    bonding the first and second layer to form the second substrate with the recess provided therein.

11. A package on package system comprising:
    a first package including a first substrate having a first integrated circuit thereon with an encapsulant over the first integrated circuit; and
    a second package including:
        a second substrate having a top surface and a recess provided only in a bottom surface,
        a second integrated circuit on the top surface, and
        a second encapsulant on the second integrated circuit and the top surface with none of the second encapsulant in the recess; and
    solder balls between the second substrate bottom surface and the first substrate includes the second package mounted on the first package having the encapsulant of the first package at least partially nested in the recess and the encapsulant has a gap separating the entire surface of the encapsulant from the second substrate.

12. The system as claimed in claim 11 further comprising encapsulant around the first integrated circuit and in the recess.

13. The system as claimed in claim 11 further comprising electrical connections between the first and second substrates.

14. The system as claimed in claim 11 further comprising electrical connections on the first substrate under the first integrated circuit.

15. The system as claimed in claim 11 wherein the second substrate further comprises:
 a first layer for having the first integrated circuit thereon; and
 a second layer having a through opening provided therein to cooperate with the first layer to form the recess.

16. A package on package system comprising:
 a first package including:
  a first substrate; and
  an encapsulant encapsulating an encapsulated first set of integrated circuits on the first substrate;
 a second package including:
  a second substrate having a top surface and a recess provided only in a bottom surface, and with the encapsulant at least partially nested in the recess and the encapsulant having a gap separating the entire surface of the encapsulant from the second substrate;
  a second set of integrated circuits mounted on the top surface; and
  a second encapsulant encapsulating the second set of integrated circuits and the top surface.

17. The system as claimed in claim 16 further comprising the encapsulated first set of integrated circuits bonded to the second substrate.

18. The system as claimed in claim 16 further comprising ball grid array connections between the first and second substrates.

19. The system as claimed in claim 16 further comprising ball grid array connections on the first substrate under the first set of integrated circuits.

20. The system as claimed in claim 16 wherein providing the second substrate further comprises:
 a first layer for carrying the first set of integrated circuits thereon;
 a second layer having a through opening provided therein; and
 adhesive bonding the first and second layer to form the second substrate with the recess provided therein.

* * * * *

UNITED STATES PATENT AND TRADEMARK OFFICE
CERTIFICATE OF CORRECTION

PATENT NO.      : 8,169,064 B2
APPLICATION NO. : 11/849263
DATED           : May 1, 2012
INVENTOR(S)     : Kim

It is certified that error appears in the above-identified patent and that said Letters Patent is hereby corrected as shown below:

Column 5:
line 9, delete "grid array (BOA) interface" and insert therefor --grid array (BGA) interface--

Signed and Sealed this
Eighteenth Day of September, 2012

David J. Kappos
*Director of the United States Patent and Trademark Office*